(12) United States Patent
Lin et al.

(10) Patent No.: US 10,247,488 B2
(45) Date of Patent: Apr. 2, 2019

(54) HEAT DISSIPATION DEVICE

(71) Applicant: ASIA VITAL COMPONENTS CO., LTD., New Taipei (TW)

(72) Inventors: Sheng-Huang Lin, New Taipei (TW); Yuan-Yi Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 183 days.

(21) Appl. No.: 14/857,779

(22) Filed: Sep. 17, 2015

(65) Prior Publication Data

US 2017/0082377 A1     Mar. 23, 2017

(51) Int. Cl.
| | |
|---|---|
| *F28D 15/00* | (2006.01) |
| *F28F 3/02* | (2006.01) |
| *F28D 15/02* | (2006.01) |
| *H01L 23/427* | (2006.01) |
| *H01L 21/48* | (2006.01) |

(52) U.S. Cl.
CPC ............ *F28F 3/02* (2013.01); *F28D 15/0233* (2013.01); *F28D 15/0275* (2013.01); *H01L 21/4882* (2013.01); *H01L 23/427* (2013.01)

(58) Field of Classification Search
CPC ...... F28F 3/02; H01L 23/427; F28D 15/0275; F28D 15/0233
USPC ............................................ 165/80.4, 104.26
See application file for complete search history.

(56) References Cited

U.S. PATENT DOCUMENTS

| | | | | |
|---|---|---|---|---|
| 6,094,919 | A * | 8/2000 | Bhatia | H01L 23/38 165/104.21 |
| 6,408,934 | B1 * | 6/2002 | Ishida | F28D 15/0233 165/104.33 |
| 7,493,939 | B2 * | 2/2009 | Xia | H01L 23/427 165/104.26 |
| 9,976,813 | B2 * | 5/2018 | Yu | F28D 15/0233 |
| 2007/0261244 | A1 * | 11/2007 | Cheng | B21D 39/00 29/890.03 |
| 2009/0059524 | A1 * | 3/2009 | Peng | H01L 23/427 361/697 |
| 2010/0126700 | A1 * | 5/2010 | Chen | F28D 15/0233 165/104.26 |
| 2011/0192026 | A1 * | 8/2011 | Chen | B21C 37/24 29/890.03 |
| 2012/0222840 | A1 * | 9/2012 | Huang | F28D 15/0275 165/104.26 |
| 2013/0056179 | A1 * | 3/2013 | Wu | F28D 15/0275 165/104.26 |
| 2013/0126125 | A1 * | 5/2013 | Wang | F28D 15/0275 165/67 |
| 2014/0138057 | A1 * | 5/2014 | Horng | F28D 15/0233 165/104.26 |

(Continued)

*Primary Examiner* — Claire Rojohn, III
(74) *Attorney, Agent, or Firm* — Jackson IPG PLLC; Demian K. Jackson

(57) ABSTRACT

A heat dissipation device includes a substrate and at least one heat pipe, which is pressed to tightly fit in a receiving groove defined by the substrate to make two opposite lateral sides of the heat pipe tightly respectively in contact with two opposite inner sides of the receiving groove to tightly connect the substrate to the heat pipe to solve the problem existing in the conventional heat dissipation device of a poor levelness of the receiving groove on a top and a bottom side of the substrate, so as to have reduced manufacturing costs and provide uniform temperature effect.

7 Claims, 16 Drawing Sheets

(56) References Cited

U.S. PATENT DOCUMENTS

| | | | | |
|---|---|---|---|---|
| 2014/0166245 A1* | 6/2014 | Dai | ................... | H05K 7/20336 |
| | | | | 165/104.26 |
| 2015/0216081 A1* | 7/2015 | Huang | ............... | H05K 7/20336 |
| | | | | 165/104.21 |
| 2015/0258643 A1* | 9/2015 | Lin | ........................ | B23P 15/26 |
| | | | | 29/890.03 |
| 2015/0260462 A1* | 9/2015 | Lin | ..................... | F28D 15/0275 |
| | | | | 165/104.21 |
| 2015/0330715 A1* | 11/2015 | Yu | ........................ | F28D 15/0275 |
| | | | | 165/104.26 |
| 2016/0091258 A1* | 3/2016 | Ahamed | ............ | F28D 15/0233 |
| | | | | 165/104.26 |

\* cited by examiner

| Provide a substrate and at least one heat pipe. The substrate internally defines at least one receiving groove, which has at least one interference section provided thereon with or without mechanical processing, and is used for the heat pipe to be tightly fitted therein. | — S20 |

| Provide a mold. The mold has an upper mold body to press one side of the heat pipe next to the top side of the substrate to make one lateral side of the heat pipe horizontally extended to tightly in contact with one interference section provided on one inner wall of the substrate, and the other lateral side of the heat pipe horizontally extended to tightly in contact with the other inner side of the substrate, such that the substrate and the heat pipe are tightly connected to each other. | — S21 |

Fig. 8

Provide a substrate and at least one round heat pipe. The substrate internally defines at least one receiving groove, which is extended through a top and a bottom side of the substrate, and used for the heat pipe to be tightly fitted therein. — S40

Provide a mold. The mold has an upper and a lower mold body to respectively press one side of the heat pipe next to the top side of the substrate, and the other side of the heat pipe next to the bottom side to make two opposite lateral sides of the heat pipe horizontally extended to tightly in contact with two opposite inner walls of the substrate to tightly connect the substrate to the heat pipe. — S41

Fig. 9

HEAT DISSIPATION DEVICE

FIELD OF THE INVENTION

The present invention relates to a heat dissipation device, and more specifically, to a heat dissipation device that is capable of effectively controlling a receiving groove depth to maintain the levelness of a substrate on a top and a bottom side, so as to provide a uniform temperature effect.

BACKGROUND OF THE INVENTION

As rapid advance in information and electro-optical industry, electronic products have been largely upgraded and thinned in the recent years. Under the requirements of high speed, high frequency, and miniaturization, the density of heating of the electronic elements is higher and higher, so heat dissipation efficiency has become one of the key factors to determine the stability of electronic products. Since both heat pipes and heat conducting fins have high heat conductivity, they are widely used to dissipate heat in various electronic products. Both heat pipes and heat conducting fins dissipate heat mainly through a wick structure made of a vacuum copper pipe or a copper sheet provided on an inclosed inner wall of a chamber thereof by sintering. Heat produced by electronic elements, such as central processing units (CPUs), and the like is absorbed by an evaporation section corresponding to a working fluid provided in the copper pipe and then evaporated. Thereafter, the evaporated heat is dissipated via a condensing section, such as heat radiation fins or fans, and condensed into liquid due to capillary force, then flowed back to the evaporation section to complete the whole inclosed circulation.

A prior heat spreader is disclosed and includes a base. The base has a first and a second side opposite to the first side, on which an S-shaped groove is provided for an S-shaped heat pipe to be located therein. The first side of the base has a plurality of cooling fins and at least one U-shaped groove, which has one opening toward one opening of the S-shaped groove to secure the opening of the S-shaped groove. The heat spreader further includes at least one U-shaped heat pipe, which is correspondingly located in the U-shaped groove of the first side of the base. Therefore, heat accumulated in the base can be quickly transferred circumferentially from a center of the base to a periphery of the base. However, it is hard to control the S-shaped and the U-shaped groove depth and apt to cause tolerance problem. Also, when being processing, it is also apt to cause a poor levelness on a back side of the base due to releasing stress, such that the S-shaped and the U-shaped groove respectively have a top and a bottom side that are unlikely to tightly contact with the cooling fins or heat-generating elements, such as central processing units (CPUs) or graphics processing units (GPU). In addition, since the base is made of copper, it has a heavy weight.

In brief, the conventional heat dissipation device has the following disadvantages: (1) being heavy weight; (2) wasting materials; (3) having tolerance problem in groove; and (4) having a poor levelness on a bottom side of the base.

It is therefore tried by the inventor to develop an improved heat dissipation device to overcome the problems of the conventional heat dissipation device.

SUMMARY OF THE INVENTION

To solve the above problems, a primary object of the present invention is to provide a heat dissipation device that includes a substrate and at least one heat pipe, which is pressed to tightly fit in a receiving groove defined by the substrate to tightly connect the substrate to have an excellent levelness on a top and a bottom side of the substrate.

Another object of the present invention is to provide a heat dissipation device that can be manufactured at lower manufacturing costs with reduced materials and further provide uniform temperature effect.

To achieve the above and other objects, the heat dissipation device provided according to the present invention includes a substrate and at least one heat pipe. The substrate has a top and a bottom side, and internally defines a receiving groove, which is used for the heat pipe to be tightly fitted therein, and extended through the top and the bottom side of the substrate. The heat pipe has a first, a second, a third, and a fourth side, wherein the first and the second side are opposite to each other, whereas the third and the fourth side are opposite to each other. Moreover, the first and the second side of the heat pipe are respectively flush with the top and the bottom side of the substrate, whereas the third and the fourth side are pressed to tightly in contact with two opposite inner walls of the receiving groove to tightly connect the substrate to the heat pipe. With these arrangements, the substrate has an excellent levelness on a top and a bottom side thereof, and can be manufactured with reduced materials to maintain light weight, so as to provide uniform temperature effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 8 is a flow chart showing the steps included in a method for manufacturing the heat dissipation device according to a fourth preferred embodiment of the present invention;

FIG. 9 is a flow chart showing the steps included in a method for manufacturing the heat dissipation device according to a fifth preferred embodiment of the present invention;

DETAILED DESCRIPTION OF THE PREFERRED EMBODIMENTS

Figure 1:
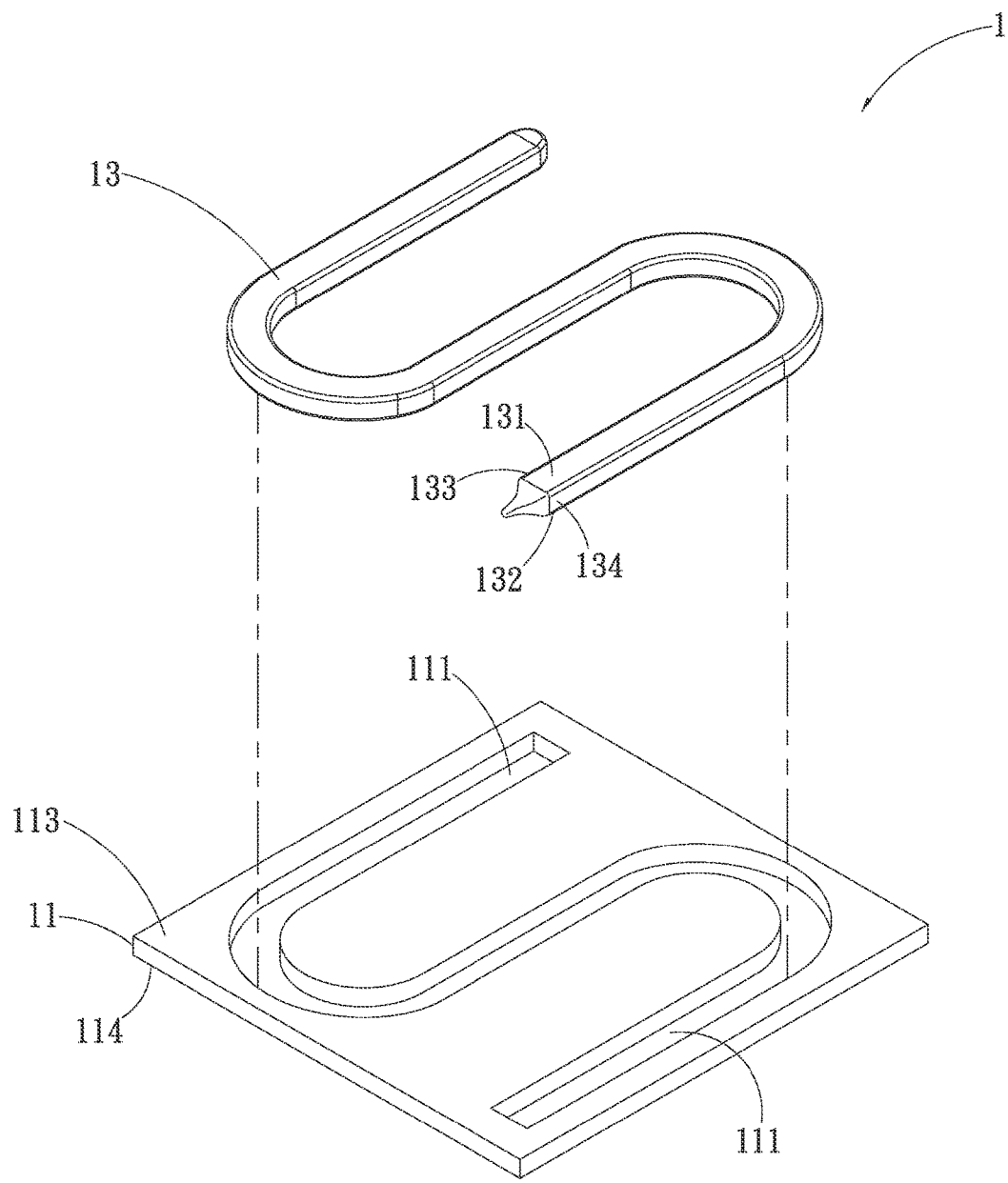
FIG. 1 is an exploded perspective view of a heat dissipation device according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2A:
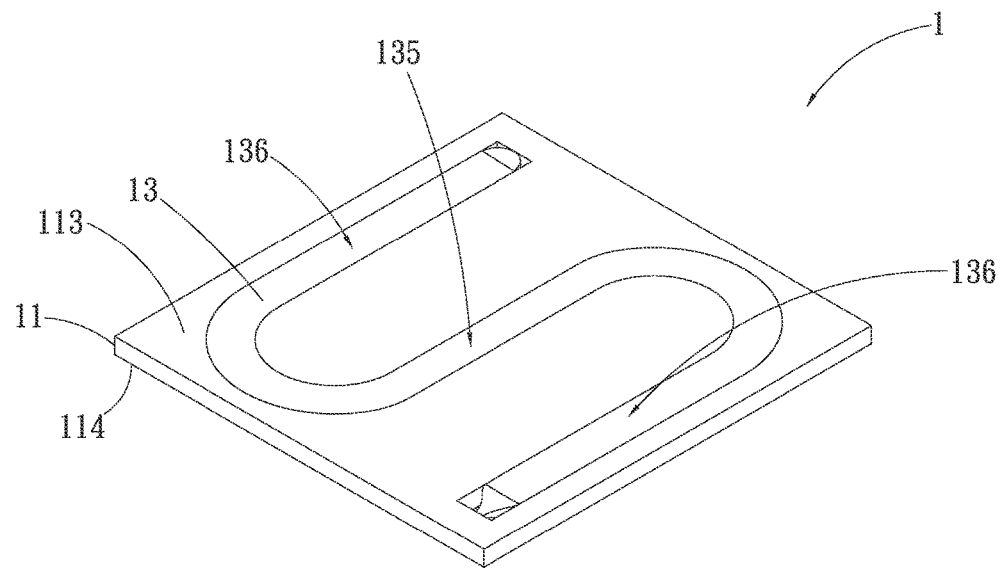
FIG. 2A is an assembled perspective view of FIG. 1.
Figure 2B:
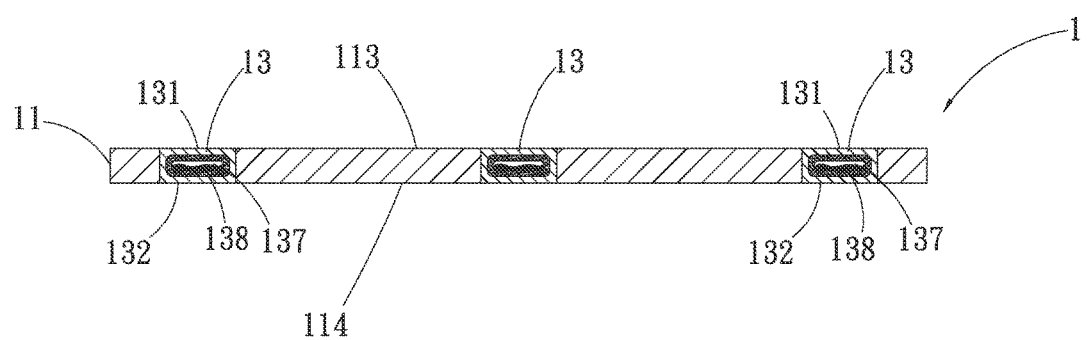
FIG. 2B is an assembled sectional view of FIG. 1.
Figure 3A:
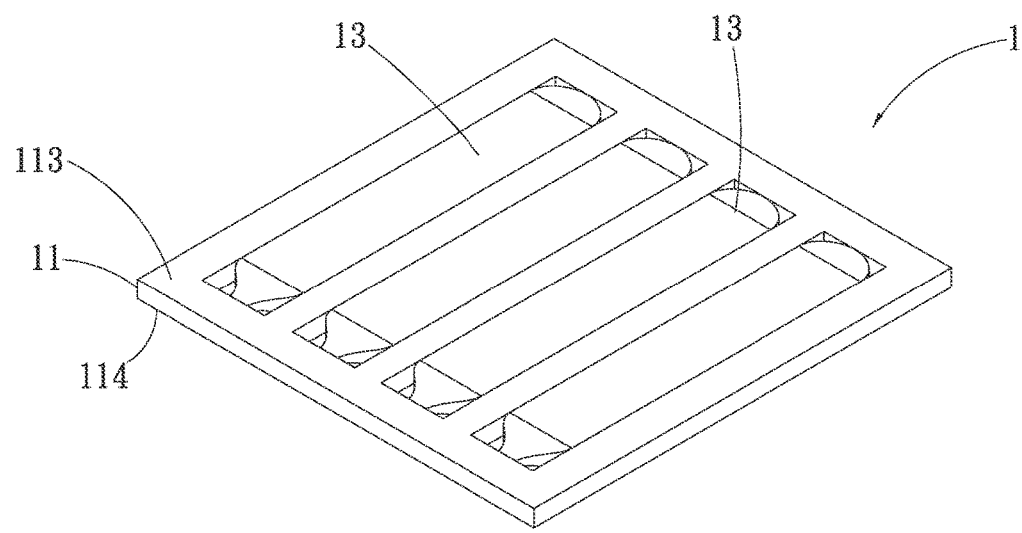
FIG. 3A is an assembled perspective view of a variant of the heat dissipation device according to the first preferred embodiment of the present invention.
Figure 3B:
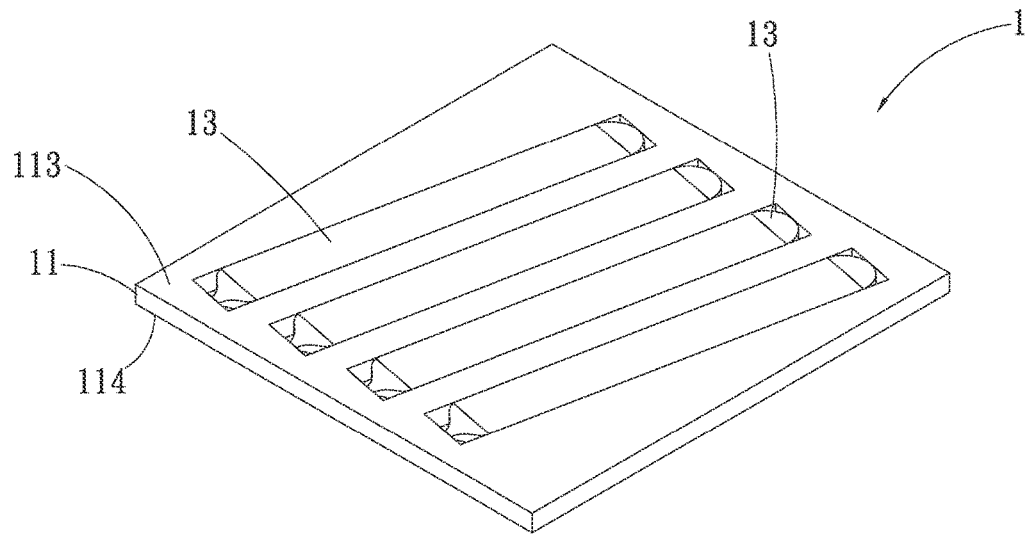
FIG. 3B is an assembled perspective view of another variant of the heat dissipation device according to the first preferred embodiment of the present invention.

Please refer to FIGS. 1, 2A, and 2B, which are exploded, assembled perspective views, and assembled sectional view, respectively, of a heat dissipation device 1 according to a first preferred embodiment of the present invention. As shown, the heat dissipation device 1 includes a substrate 11 and at least one heat pipe 13. The substrate 11 is made of a metal material, such as copper, and internally defines at least one receiving groove 111 extended from a top side 113 through a bottom side 114 of the substrate 11. In the illustrated first preferred embodiment, the receiving groove 111 can be, for example but not limited to, curved-shaped, such as S-shaped. In implementation, the shape of the receiving groove 111 can be straight-line-shaped as shown in FIG. 3A, slanted-line-shaped as shown in FIG. 3B, or other shapes, such as U-shaped, or any geometric-shaped. The heat pipe 13 is tightly fitted in the receiving groove 111. In the illustrated first preferred embodiment, only one heat pipe 13 is provided, and the shape of the heat pipe 13 is, for example but not limited to, S-shaped to correspondingly fit in the receiving groove 111. In implementation, the heat pipe 14 can be other shapes, such as U-shaped, and the number of the receiving groove 111 and the heat pipe 13 is not limited to mentioned above, and can be changed to a plurality of receiving grooves 111 extended through the substrate 111 for a plurality of heat pipes 13 to be fitted in as shown in FIGS. 3A and 3B.

The heat pipe 13 has a heat absorbed and a heat dissipation section 135, 136, a first, a second, a third, and a fourth side 131, 132, 133, and 134, and a chamber 137, in which a wick structure 138, such as sintered powder structures, meshes, or grooves, is provided therein and a working fluid is filled with therein. In the illustrated first preferred embodiment, the first and the second side 131, 132 of the heat pipe 13 is formed by mechanical processing, such as stamp-processing, extruding-processing, rolling-processing, forging-processing, and the like, so that the first and the second side 131, 132 of the heat pipe 13 are respectively flush with the top and the bottom side 113, 114 of the substrate 11. Meanwhile, the third and the fourth side 133, 134 of the heat pipe 13 is pressed to tightly respectively in contact with two opposite inner walls of the receiving groove 111 to tightly connect the substrate 11 to the heat pipe 13 to form the heat dissipation device 1. With these arrangements, the substrate 11 has an excellent levelness on the top and the bottom side 113, 114, and the heat dissipation device 1 can be manufactured with reduce materials and leave holding elements out for holding the heat pipe 13.

Figure 4:
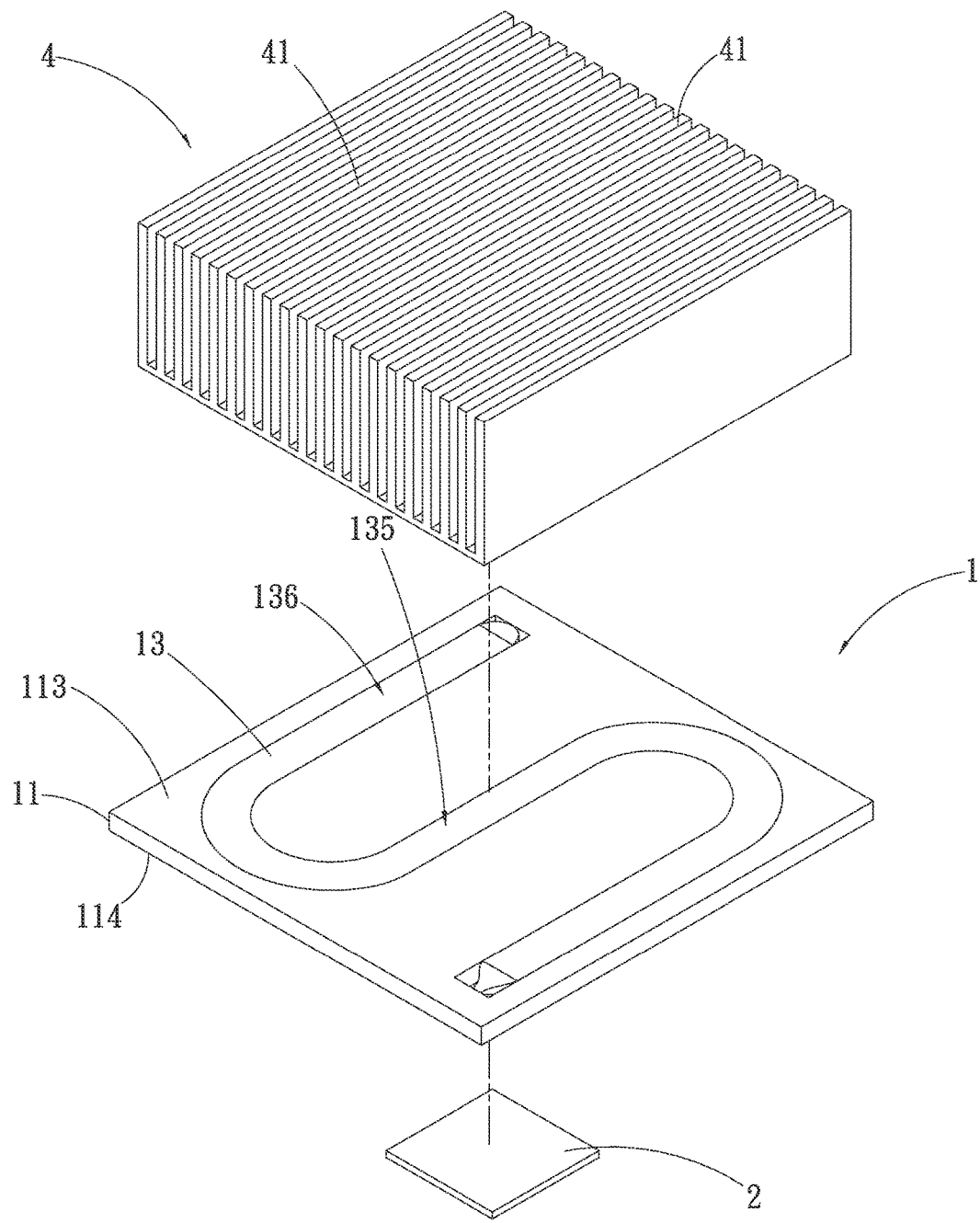
FIG. 4 is an exploded perspective view of still another variant of the heat dissipation device according to the first preferred embodiment of the present invention.

Please refer to FIG. 4, which is a perspective view of still another variant of the heat dissipation device according to the first embodiment of the present invention, along with FIG. 2A and FIG. 2B. As shown, the heat absorbed section 135 of the heat pipe 13 is located corresponding to a center of the substrate 11 and attached to a heat generating element 2, such as central processing units (CPUs) or graphics processing units (GPU). Since the substrate 11 has an excellent levelness on the top and the bottom side 113, 114, and the bottom side 114 of the substrate 11 and the second side 132 of the heat pipe 13 are disposed on the same plane, so that the bottom side 114 of the substrate 11 together with the second side 132 of the heat pipe 13 are tightly attached to the heat generating element 2. The heat dissipation section 136 is, for example but not limited to, far away from the heat absorbed section 135 towards a periphery of the substrate 11. In implementation, according to actual need, the first and the second side 131, 132 of the heat pipe 13 can be respectively attached to a heat generating element 2, such as CPUs, GPUs, at the same time. In addition, the first side 131 of the heat pipe 13 can be correspondingly connected to a heat spreader 4 with a plurality of heat radiation fins 41, so one side of the heat spreader 4 is tightly attached to the first side 131 of the heat pipe 13 and the top side 113 of the substrate 11. Therefore, heat produced by the heat generating element 2 is absorbed by the second side 132 of the heat pipe 13 and transferred to the heat dissipation section 136 of the heat pipe 13 and the heat spreader 3 above the first side 131 of the heat pipe 13, and then dissipated into the ambient air. In the mean time, part of the heat is conducted to two opposite inner walls of the receiving groove 111 via the third and the fourth side 133, 134 of the heat pipe 13, and then quickly transferred circumferentially to the whole substrate 11 to uniform the temperature, such that the heat accumulated in the substrate 11 can be quickly diffused.

With these arrangements, it is not only easy to control the levelness on the top and the bottom side 113, 114 of the substrate 11, but also can effectively manufacture the heat dissipation device 1 with reduced materials to save the manufacturing costs and keep a light weight, so as to provide uniform temperature effect. Furthermore, the present invention also solve the problem existing in the conventional heat dissipation device of controlling the groove depth by the receiving groove 111 being extended through the substrate 11.

Figure 5:
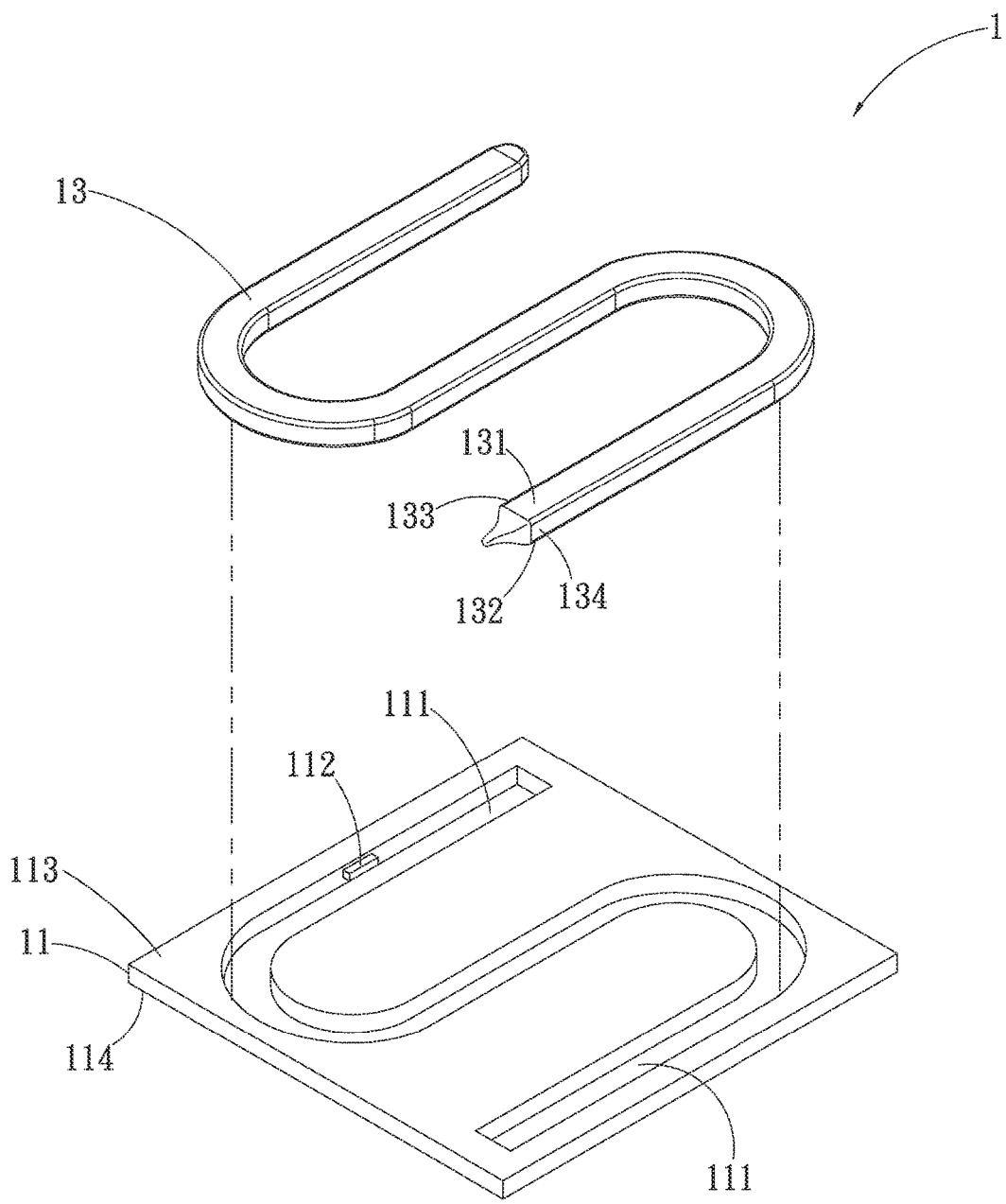
FIG. 5 is an exploded perspective view of the heat dissipation device according to a second preferred embodiment of the present invention.
Figure 5A:
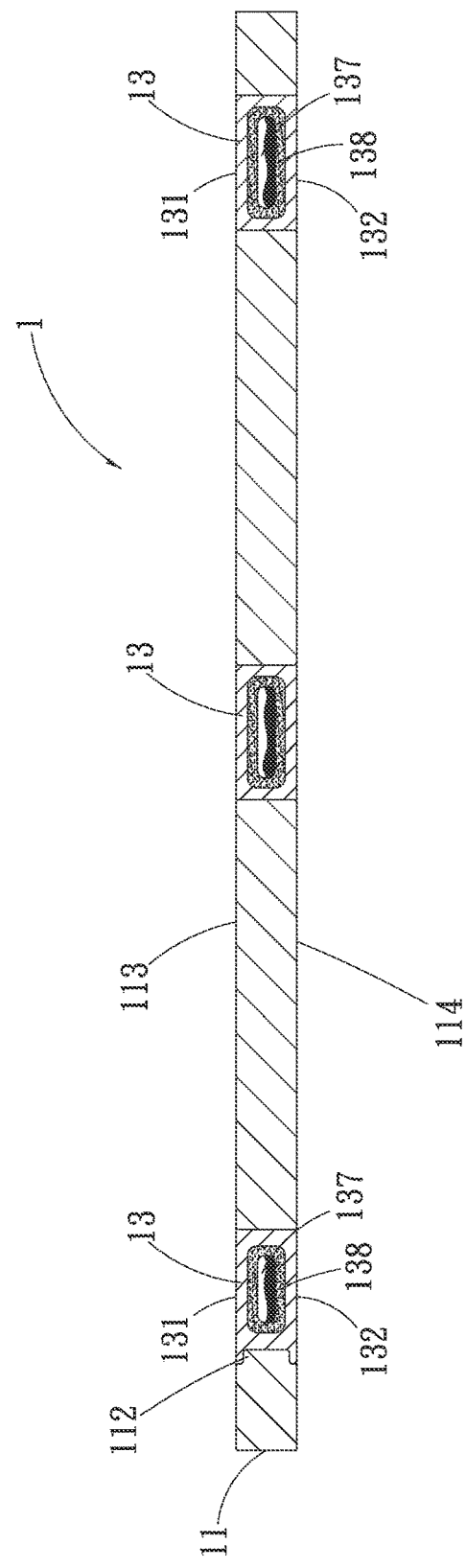
FIG. 5A is an assembled sectional view of FIG. 5

Please refer to FIGS. 5 and 5A, which are exploded and assembled perspective views, respectively, of the heat dissipation device according to a second preferred embodiment of the present invention. As shown, the second embodiment of the heat dissipation device 1 is generally structurally similar to the first embodiment except that, in this second embodiment, the receiving groove 111 further has at least one interference section 112, which can be, for example but not limited to, a protrusion, an embossed surface, a recess, any combinations thereof. The rough surface can be a small tooth face, a convex surface, or granular surface. The interference section 112 is form on at least one inner wall of the receiving groove 111, and in the illustrated second preferred embodiment, the interference section 112 is a protrusion, such as a salient point, a salient strip, or any geometric shape, and at least one protrusion continuously or spacely or staggeredly formed on at least one inner wall of the receiving groove 111 as shown in FIGS. 5 and 5A. In addition, the inference section 112 is used for increasing gripping force of the third and the fourth side 133, 134 of the heat pipe 13. In one possible embodiment, the interference section 112 can be a protrusive long strip continuously formed on one inner wall of the receiving groove 111 to increase gripping force of the third and the fourth side 133, 134 of the heat pipe 13. Therefore, with the interference section 112, the gripping force of the substrate 11 and the heat pipe 13 can be effectively increased, and the configuration of the interference section 112 can be changed according actual need.

Figure 6:
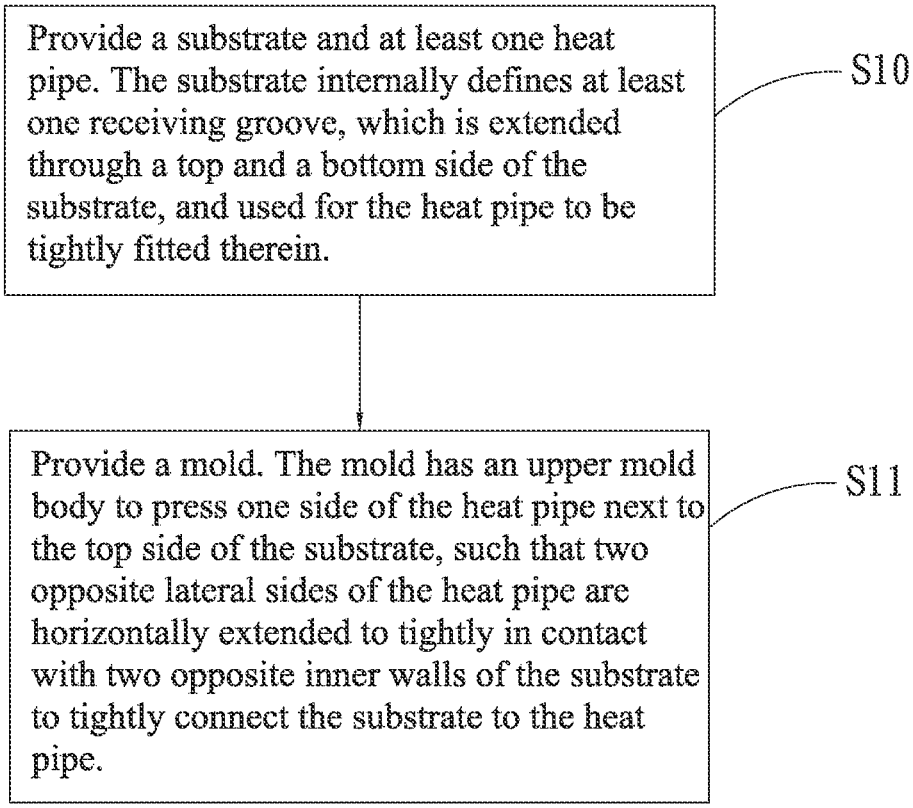
FIG. 6 is a flow chart showing the steps included in a method for manufacturing the heat dissipation device according to a third preferred embodiment of the present invention.

Please refer to FIG. 6, which is a flow chart showing the steps included in a method for manufacturing the heat dissipation device according to a third preferred embodiment of the present invention along with FIGS. 1, 2A, 2B.

In the Step 10, a substrate 11 and at least one heat pipe 13 are provided. The substrate 11 internally defines at least one receiving groove 111, which is used for the heat pipe 13 to be tightly fitted therein and extended through the top and the bottom side 113, 114 of the substrate 11. The heat pipe 13 has a height higher than the top side 113 of the substrate 11. A gap 14 is formed between the heat pipe 13 and two opposite inner walls of the receiving groove 111, and in other words, the receiving groove 111 has a diameter bigger than that of the heat pipe 13.

Figure 7A:
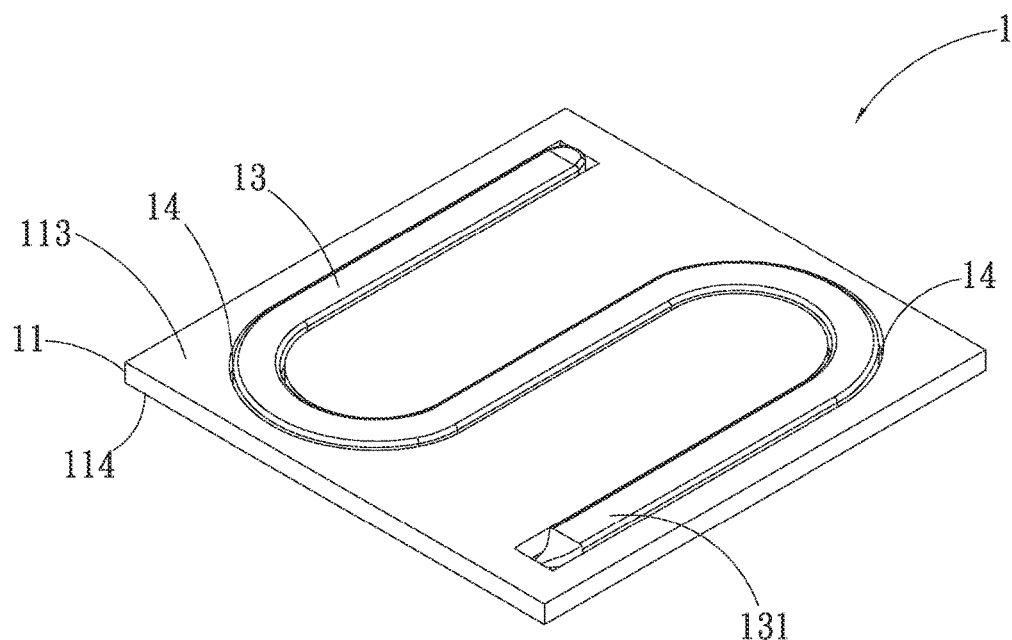
FIG. 7A is an assembled perspective view of the heat dissipation device according to the third preferred embodiment of the present invention.
Figure 7B:
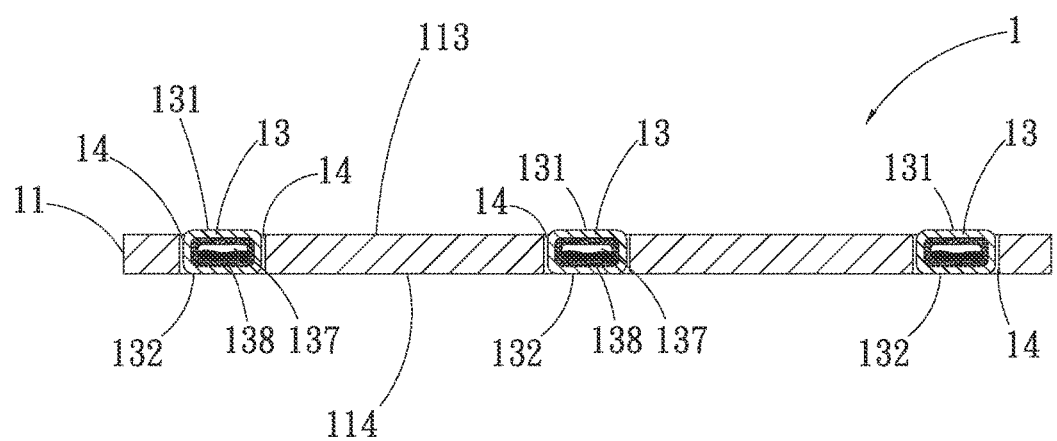
FIG. 7B is an assembled sectional view of FIG. 7A.

More specifically, a metal substrate 11, such as a copper or an aluminum substrate, and at least one heat pipe 13 are provided. The substrate 11 internally defines at least one receiving groove 111, which is used for the heat pipe 13 to be tightly fitted therein as shown in FIG. 7A and extended from the top side 113 of the substrate 11 through the bottom side 114 of the substrate 11. The heat pipe 13 has a height higher than the top side 113 of the substrate 11, and a diameter smaller than that of the receiving groove 111. A gap 14 is formed between the heat pipe 13 and two opposite inner walls of the receiving groove 111, and in other words, the heat pipe 13 is loosely located in the receiving groove 111 as shown in FIG. 7B. In the illustrated third preferred embodiment, the receiving groove 111 can be, for example but not limited to, a curved-shaped, such as S-shaped. In implementation, the shape of the receiving groove 111 can be straight-line-shaped as shown in FIG. 3A, slanted-line-shaped as shown in FIG. 3B, or other shape, such as U-shaped, or any geometric-shaped, and the number and the shape of the receiving groove 111 is corresponding to those of the heat pipe 13. With the receiving groove 111 being extended through the substrate 11, the present invention also solve the problem existing in the conventional heat dissipation device of controlling the groove depth to cause tolerance. In the illustrated third preferred embodiment, the heat pipe 13 is pressed into an S-shaped flat heat pipe first, so that the heat pipe 13 can be, for example but not limited to, correspondingly located in the S-shaped receiving groove 111. In implementation, the shape of the heat pipe 13 can be changed into other shapes, such as U-shaped, according to actual need.

In the Step 10, a mold 3 is provided. The mold 3 has an upper mold body 31 to press one side of the heat pipe 13 next to the top side of the substrate 11 to make two opposite lateral sides of the heat pipe 13 horizontally extended to fill the gap 14 and tightly in contact with two opposite inner walls of the receiving groove 111 to tightly connect the substrate 11 to the heat pipe 13.

More specifically, a mold 3 is provided. The mold 3 has an upper mold body 31 to press the first side 131 of the heat pipe 13 next to the top side 113 of the substrate 11 to make the third and the fourth side 133, 134 of the heat pipe 13 horizontally extended to fill the gap 14 and tightly in contact with two opposite inner walls of the receiving groove 111 to tightly connect the substrate 11 to the heat pipe 13 to form the heat dissipation device 1. With the method mentioned above, it not only solves the problem existing in the conventional heat dissipation device of having a poor levelness on the bottom side of the substrate, but also improves the problem of wasting materials and heavy weight.

After Step 11, the first side 131 of the heat pipe 13 next to the top side 113 of the substrate 11 is flattened by milling processing or planning processing to flush with each other.

Referring to FIG. 4 again, the second side 132 of the heat absorbed section 135 is attached to a heat generating element 2, such as CPUs or GPUs. Since the substrate 11 has an excellent levelness on the top and the bottom side 113, 114, and the bottom side 114 of the substrate 11 and the second side 132 of the heat pipe 13 are disposed on the same plane, so that the bottom side 114 of the substrate 11 together with the second side 132 of the heat pipe 13 are tightly attached to the heat generating element 2. The heat dissipation section 136 is, for example but not limited to, far away from the heat absorbed section 135 towards a periphery of the substrate 11. In implementation, according to actual need, the first and the second side 131, 132 of the heat pipe 13 can be respectively attached to a heat generating element 2, such as CPUs, GPUs, at the same time. In addition, the first side 131 of the heat pipe 13 can be correspondingly connected to a heat spreader 4 with a plurality of heat radiation fins 41, so one side of the heat spreader 4 is tightly attached to the first side 131 of the heat pipe 13 and the top side 113 of the substrate 11.

With the substrate 11 and the heat pipe 13 being tightly connected to each other to form the heat dissipation device 1, the heat dissipation device 1 that is capable of effectively controlling a receiving groove depth to maintain the levelness of the substrate 11 on a top and a bottom side 113, 114 and manufactured with reduced materials, so as to provide a uniform temperature effect.

Please refer to FIG. 8, which is a flow chart showing the steps included in a method for manufacturing the heat dissipation device according to a fourth preferred embodiment of the present invention along with FIGS. 5 and 5A.

In the Step 20, a substrate 11 and at least one heat pipe 13 are provided. The substrate 11 internally defines at least one receiving groove 111, which is used for the heat pipe 13 to be tightly fitted therein and extended through the top and the bottom side 113, 114 of the substrate 11. The heat pipe 13 has a height higher than the top side 113 of the substrate 11. At least one interference section 112 is formed on at least one inner wall of the receiving groove 111. The heat pipe 13 has a height higher than that of that of the top side 113 of the substrate 11. And a gap 14 is formed between the heat pipe 13 and two opposite inner walls of the receiving groove 111.

Figure 11:
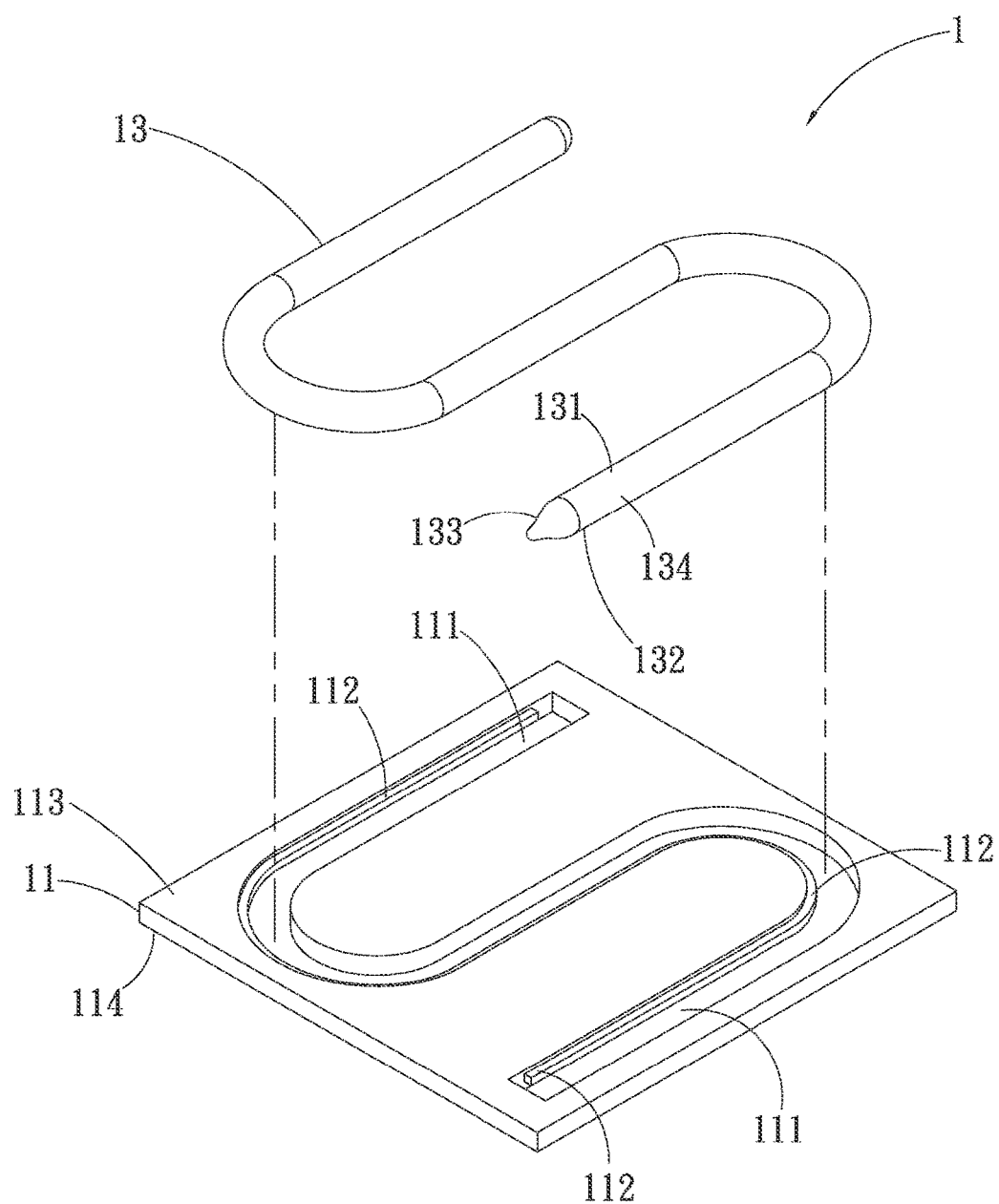
FIG. 11 is an exploded perspective view showing a round heat pipe before being located into the substrate.

More specifically, a metal substrate 11, such as a copper or an aluminum substrate, and at least one heat pipe 13 are provided. The substrate 11 internally defines at least one receiving groove 111, which is used for the heat pipe 13 to be tightly fitted therein as shown in FIG. 7A and extended from the top side 113 of the substrate 11 through the bottom side 114 of the substrate 11. The receiving groove 111 is provided on at least one inner wall thereof with at least one interference section 112, which can be, for example but not limited to, a protrusion as shown in FIG. 5, a long strip as shown in FIG. 11. In implementation, the interference section 112 can be made a rough surface, an embossed surface, a recess, or any combinations thereof by mechanical processing. The rough surface can be a small tooth face, a convex surface, or granular surface. The interference section 112 can be formed integrally on at least one inner wall of the receiving groove 111, or the interference section 112 can be changed into a plurality thereof formed on one inner wall of the receiving groove 111. In the illustrated fourth preferred embodiment, the heat pipe 13 is, for example but not limited to, pressed into an S-shaped flat heat pipe first. In implementation, the heat pipe 13 can be changed into an integrated round heat pipe, according to actual need.

After that, the heat pipe 13 is correspondingly located in the receiving groove 111. The heat pipe 13 has a height higher than the top side 113 of the substrate 11, and has a diameter smaller than that of the receiving groove 111. A gap 14 is formed between the heat pipe 13 and two opposite inner walls of the receiving groove 111, and in other words, the heat pipe 13 is loosely located in the receiving groove 111. In the illustrated fourth preferred embodiment, the receiving groove 111 can be, for example but not limited to, a curved-shaped, such as S-shaped. In implementation, the shape of the receiving groove 111 can be straight-line-shaped as shown in FIG. 3A, slanted-line-shaped as shown in FIG. 3B, and the number and the shape of the receiving groove 111 is corresponding to those of the heat pipe 13. With the receiving groove 111 being extended through the substrate 11, the present invention also solve the problem existing in the conventional heat dissipation device of controlling the groove depth to cause tolerance.

In the Step 21, a mold 3 is provided. The mold 3 has an upper mold body 31 to press one side of the heat pipe 13 next to the top side of the substrate 11 to make one lateral side of the heat pipe 13 horizontally extended to fill the gap 14 and tightly in contact with the interference section 12 formed one inner wall of the receiving groove 111. At the same time, the other opposite lateral side of heat pipe 13 is pressed to horizontally extend to fill the gap 14 and tightly in contact with the other opposite inner wall of the receiving groove 111 to tightly connect the substrate 11 to the heat pipe 13.

Figure 7C:
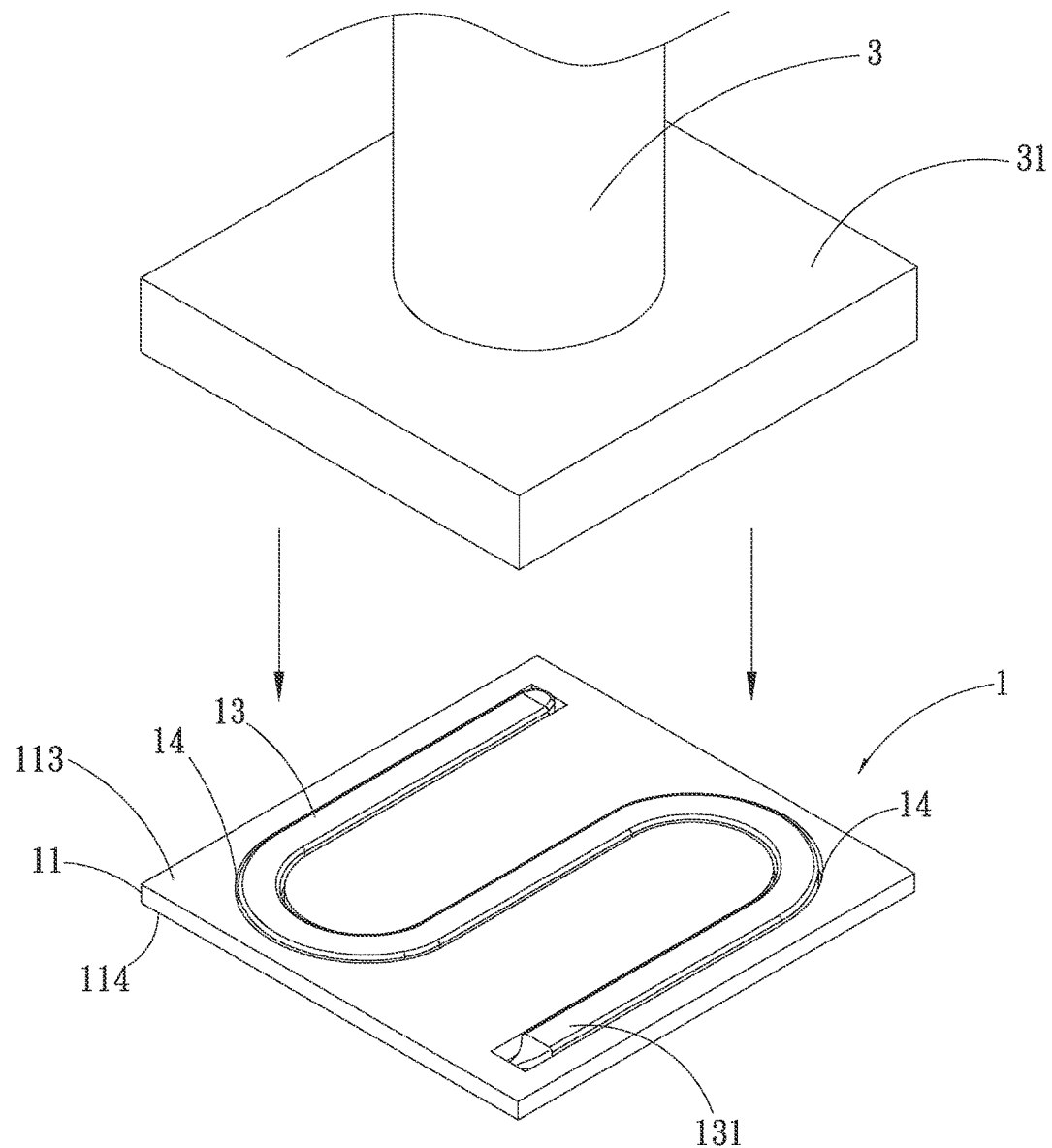
FIG. 7C shows a heat pipe located in a substrate is pressed by a mold according to the third preferred embodiment of the present invention.

More specifically, a mold 3 is provided. The mold 3 has an upper mold body 31 to press the first side 131 or the second side 132 of the heat pipe 13 next to the top side 113 of the substrate 11 as shown in FIG. 7. In implementation, the mold 3 can further include an upper and a lower mold body 31, 32 as shown in FIG. 10D. The first side 131 of the heat pipe 13 next to the top side 113 of the substrate 11 is pressed by the upper mold body 31, whereas the second side 132 of the heat pipe 13 next to the bottom side 114 of the substrate 11 is pressed by the lower mold body 32. In the illustrated fourth preferred embodiment, the mold 3 is formed, for example but not limited to, by stamp-processing. In implementation, the mold 3 can be formed by extruding-processing, rolling-processing, forging-processing, and the like.

After that, the third side 133 of the heat pipe 13 is pressed to horizontally extend to fill the gap 14 and tightly in contact with the interference section 12 formed one inner wall of the receiving groove 111. At the same time, the fourth side 134 of heat pipe 13 is pressed to horizontally extend to fill the gap 14 and tightly in contact with the other opposite inner wall of the receiving groove 111, such that the third and the fourth side 133, 134 of the heat pipe 13 are respectively tightly in contact with two opposite inner walls of the receiving groove 111 to tightly connect the substrate 11 to the heat pipe 13 to form the heat dissipation device 1. With the interference section 112, the gripping force is increased of the substrate 11 and the heat pipe 13.

Furthermore, in implementation, a plurality of interference sections 112 is formed on two opposite inner walls of the receiving groove 111, when being pressed, two opposite lateral sides of the heat pipe 13 are horizontally extended to fill the gap 14 and tightly in contact with the interference sections 112 on the two opposite inner walls of the receiving groove 111, such that the heat pipe 13 are tightly connect to the substrate 11 to form the heat dissipation device 1. With the interference section 112, the gripping force is increased of the substrate 11 and the heat pipe 13.

After Step 21, the first side 131 of the heat pipe 13 and the top side 113 of the substrate 11 are simultaneously flattened by milling processing or planning processing to flush with each other.

With the substrate 11 and the heat pipe 13 being tightly connected to each other to form the heat dissipation device 1, the heat dissipation device 1 that is capable of effectively controlling a receiving groove depth to maintain the excellent levelness of the substrate 11 on a top and a bottom side 113, 114 and manufactured with reduced materials, so as to provide a uniform temperature effect.

Please refer to FIG. 9, which is a flow chart showing the steps included in a method for manufacturing the heat dissipation device according to a fifth preferred embodiment of the present invention along with FIGS. 2A, 2B, and 10D. The Steps 40 and 41 included in the fifth preferred embodiment of the heat dissipation device 1 are generally structurally similar to the Steps 10 and 11 included in the third embodiment except that, in this fifth embodiment, the flat heat pipe included of Step 11 is a round heat pipe, and the mold 3 further includes an upper and a lower mold body 32, 33.

Figure 10A:
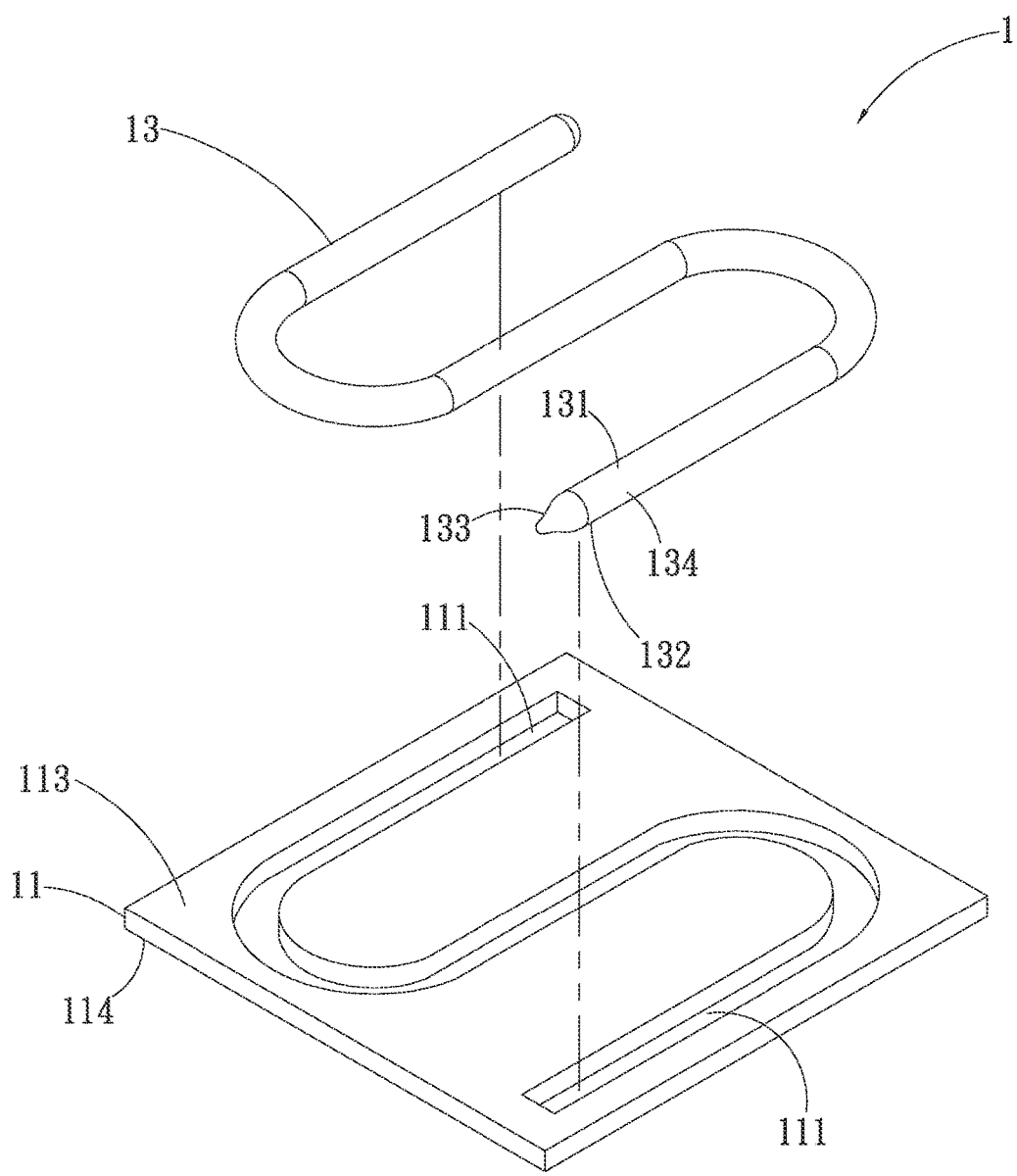
FIG. 10A is a perspective view showing a round heat pipe before being located into the substrate.
Figure 10B:
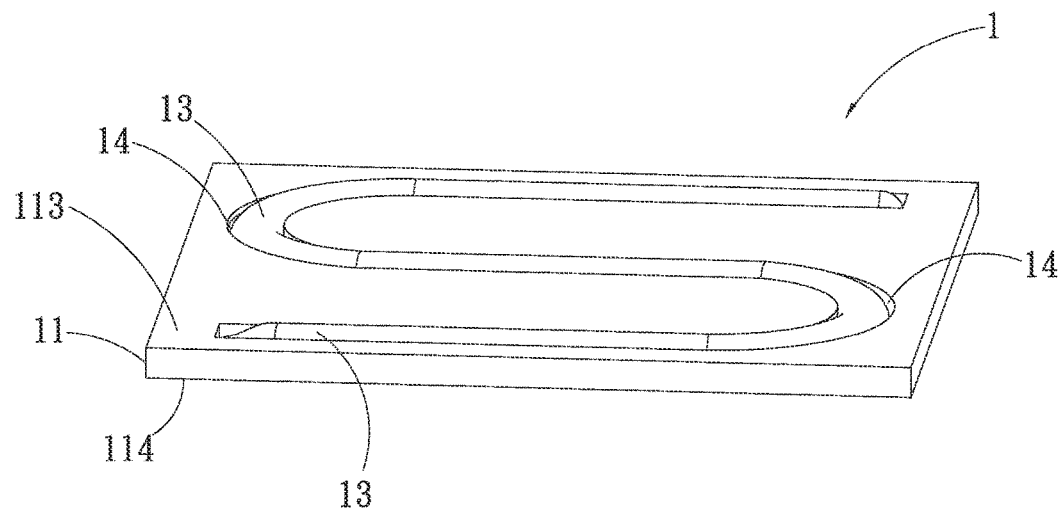
FIG. 10B is a perspective view showing the round heat pipe of FIG. 10A after being located in the substrate.
Figure 10C:
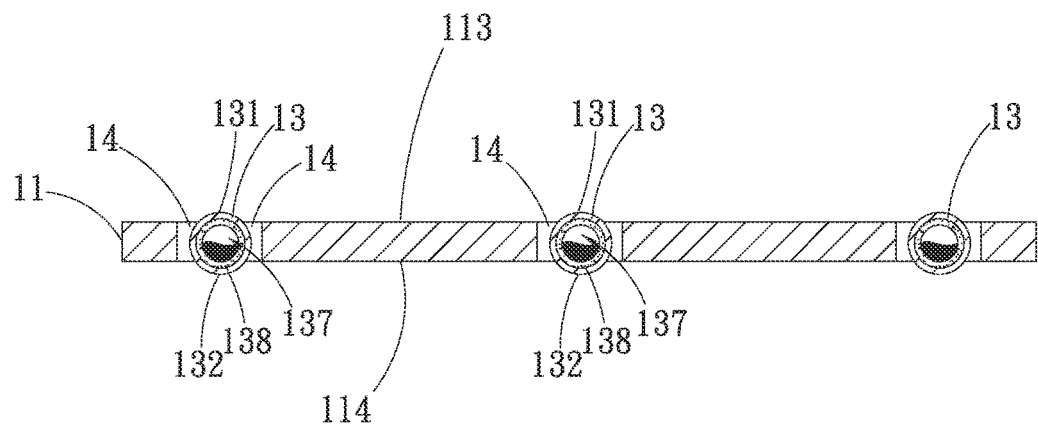
FIG. 10C is an assembled sectional view showing the round heat pipe of FIG. 10A after being located in the substrate.
Figure 10D:
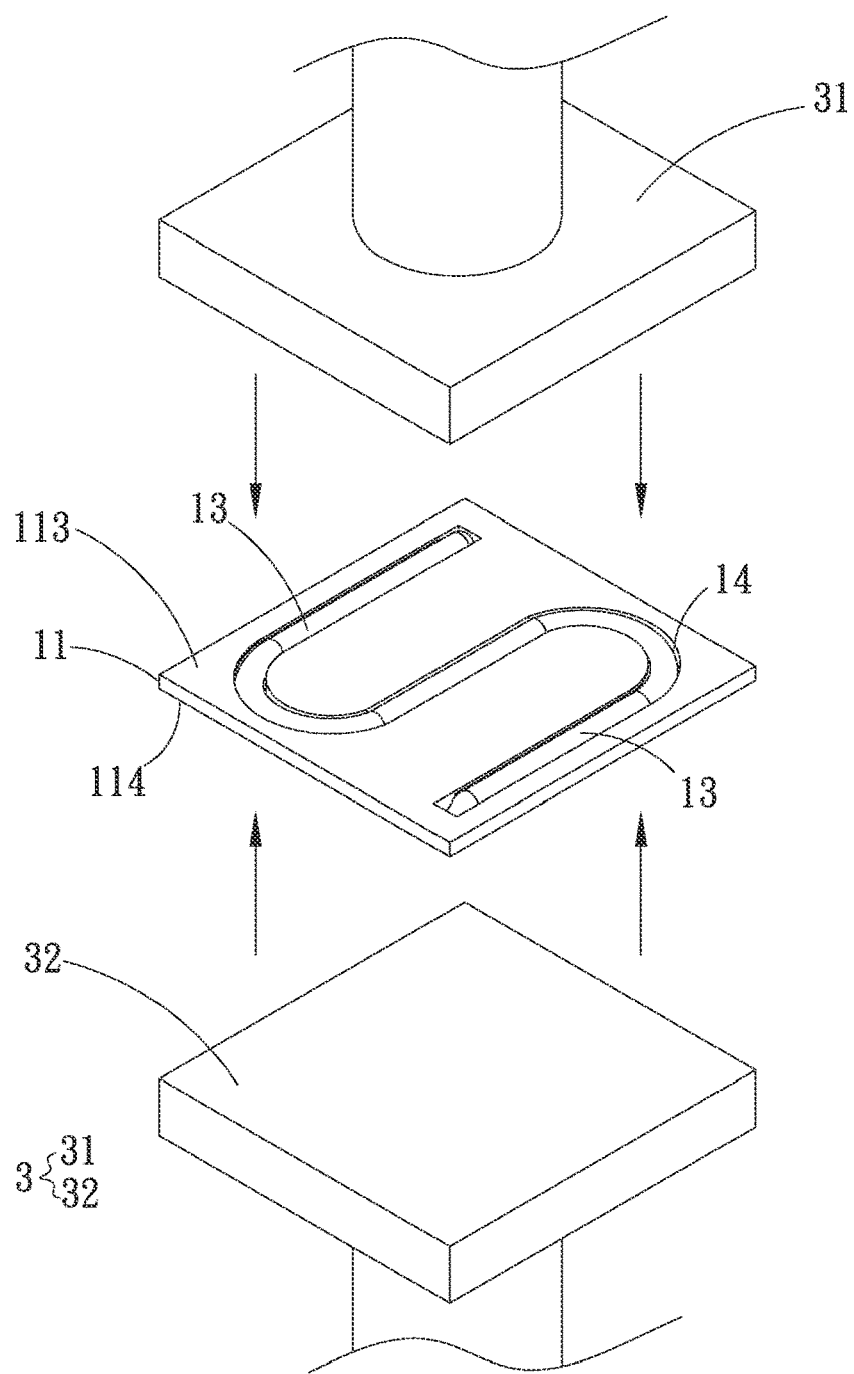
FIG. 10D is a perspective view showing an upper and a lower mold body respectively pressing to the round heat pipe of FIG. 10A located in the substrate.

In the Step 40, a substrate 11 and at least one round heat pipe 13 are provided as shown in FIG. 10A. The substrate 11 internally defines at least one receiving groove 111, which is used for the heat pipe 13 to be tightly fitted therein as shown in FIG. 10B and extended through the top and the bottom side 113, 114 of the substrate 11. The heat pipe 13 has a height higher than the top side 113 of the substrate 11. A gap 14 is formed between the heat pipe 13 and two opposite inner walls of the receiving groove 111 as shown in FIG. 10C. In the illustrated fifth preferred embodiment, the heat pipe 13 is, for example but not limited to, a round S-shaped heat pipe and corresponding to the S-shaped receiving groove 111. In implementation, the heat pipe 13 can be a flat heat pipe 13 as shown in FIG. 7A, or other shape, such as U-shaped heat pipe.

Figure 12:
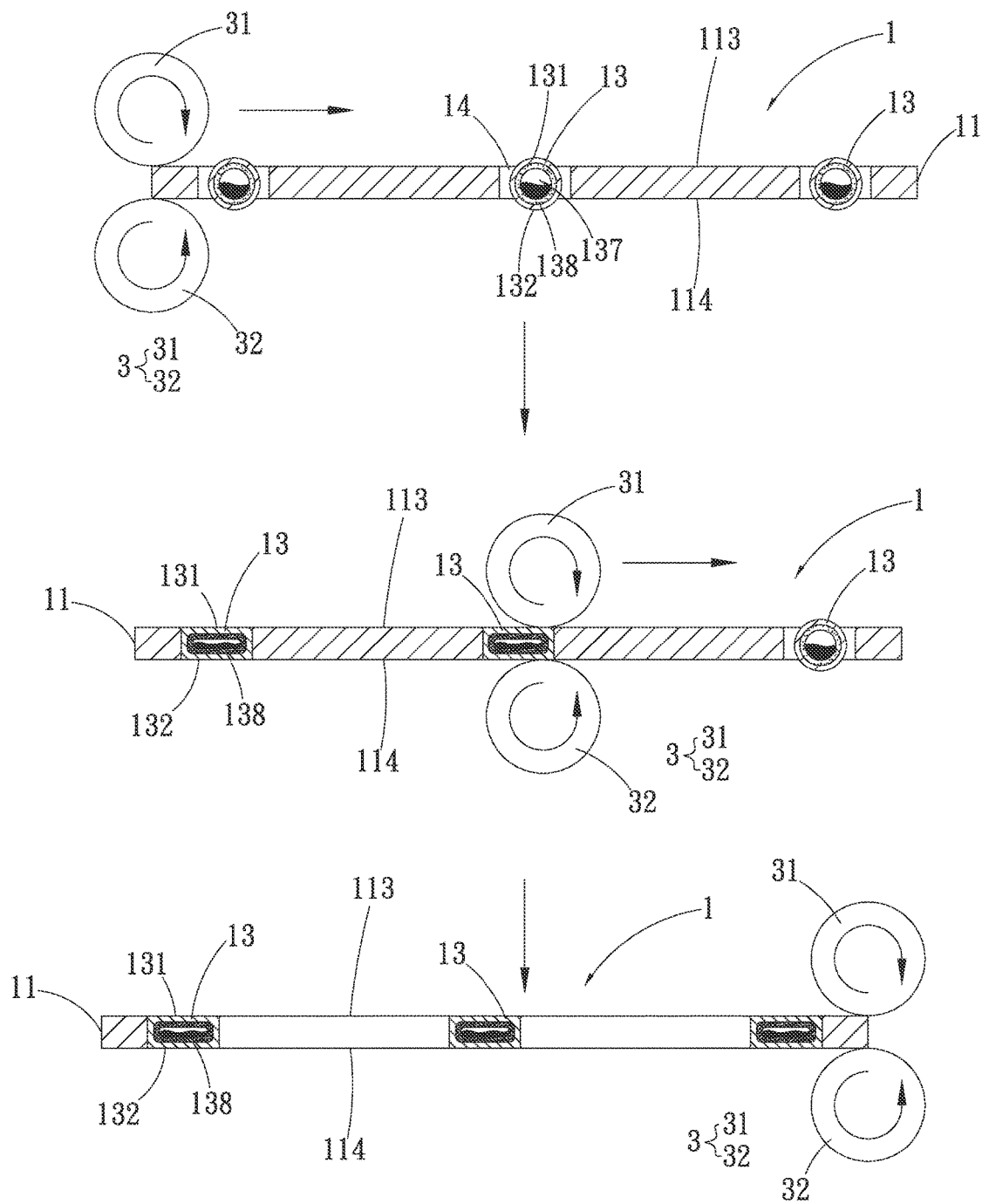
FIG. 12 is a perspective view showing a process that a round heat pipe located in the substrate with at least one interference section is pressed.

In the Step 41, a mold 3 is provided. The mold 3 includes an upper and a lower mold body 31, 32 as shown in FIG. 10D to respectively press one side of the heat pipe 13 next to the top side 113 of the substrate 11 and the other opposite side of the heat pipe 13 next to the bottom side 114 of the substrate 11 to make two opposite lateral sides of the heat pipe 13 horizontally extended to fill the gap 14 and tightly in contact with two opposite inner walls of the receiving groove 111 as shown in FIG. 2 to connect the substrate 11 to the heat pipe 13. With the method mentioned above, it not only solves the problem existing in the conventional heat dissipation device of having a poor levelness on the bottom side of the substrate, but also improves the problem of wasting materials and heavy weight. In the illustrated fifth preferred embodiment, the mold 3 is formed, for example but not limited to, by stamp-processing. In implementation, the mold 3 can be formed by extruding-processing, rolling-processing as shown in FIG. 12, forging-processing, and the like.

After Step 41, the first and the second side 131, 132 of the heat pipe 13 next to the top and the bottom side 113, 114 of the substrate 11 are simultaneously flattened by milling processing or planning processing to flush with the top and the bottom side 113, 114 of the substrate 11.

With the substrate 11 and the heat pipe 13 being tightly connected to each other to form the heat dissipation device 1, the heat dissipation device 1 that is capable of effectively controlling a receiving groove depth to maintain the levelness of the substrate 11 on a top and a bottom side 113, 114 and manufactured with reduced materials, so as to provide a uniform temperature effect.

In conclusion, the heat dissipation device of the present invention has the following advantages: (1) have an excellent levelness on the top and the bottom side of the substrate with no damage to the top and the bottom side of the substrate; (2) being manufacturing with reduced materials to save the manufacturing costs; and (3) enabling to provide uniform temperature effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device, comprising:
   a substrate having
   a top side;
   a bottom side; and
   a receiving groove disposed in the top side of the substrate, extended through the bottom side of the substrate, and having a first straight section, a second straight section, and a third straight section and an interference section on the first straight section defining a rectangular cross-section protrusion protruding from an inner wall of the receiving groove at a position medial between the top side and the bottom side and
   a heat pipe fitted in the receiving groove and having
   a first side;
   a second side opposite to the first side, the first side and the second side being respectively flush with the top side and the bottom side of the substrate;
   a third side between the first and second sides;
   a fourth side opposite to the third side, the third side and the fourth side respectively contacting two opposite inner walls of the receiving groove of the substrate to interference-fit the substrate to the heat pipe, wherein the interference section abuts against the third side of the heat pipe and wherein the heat pipe defines corresponding upper and lower deformed portions protruding from the third side defining a corresponding rectangular cross-section gripping recess which grips the interference section from a top side and from a bottom side of the interference section;
   a chamber defined by a first inner surface corresponding to the first side, a second inner surface opposite the first inner surface, a third inner surface between the first and second inner surfaces, and a fourth inner surface opposite the third inner surface,
   a wick structure formed of at least a first portion arranged on the first inner surface and a second portion arranged on the second inner surface such that the first and second portions of the wick structure do not directly contact each other, and
   a working fluid filled in the chamber.

2. The heat dissipation device as claimed in claim 1, wherein the receiving groove has a shape selected from the group consisting of straight-line-shaped, slanted-line-shaped, and curved shaped.

3. The heat dissipation device as claimed in claim 1, wherein the second side of the heat pipe is attached to a heat generating element.

4. The heat dissipation device as claimed in claim 1, wherein the second side of the heat pipe is attached to a heat generating element, whereas the first side of the heat pipe is attached to a heat spreader.

5. The heat dissipation device as claimed in claim 1, wherein the substrate is made of a metal material.

6. The heat dissipation device of claim 1, wherein the receiving groove is S-shaped.

7. The heat dissipation device of claim 1, wherein the wick structure comprises side portions arranged on the third and fourth inner surfaces.

* * * * *